United States Patent
Shao et al.

(10) Patent No.: US 7,702,061 B2
(45) Date of Patent: Apr. 20, 2010

(54) HIGH SPEED HYBRID STRUCTURE COUNTER HAVING SYNCHRONOUS TIMING AND ASYNCHRONOUS COUNTER CELLS

(75) Inventors: Zhuyan Shao, Shanghai (CN); Juan Qiao, Shanghai (CN)

(73) Assignee: Integrated Device Technology, Inc., San Jose, CA (US)

( * ) Notice: Subject to any disclaimer, the term of this patent is extended or adjusted under 35 U.S.C. 154(b) by 13 days.

(21) Appl. No.: 12/002,614

(22) Filed: Dec. 17, 2007

(65) Prior Publication Data

US 2009/0154637 A1   Jun. 18, 2009

(51) Int. Cl.
*H03K 21/00* (2006.01)
*H03K 23/00* (2006.01)

(52) U.S. Cl. ................ 377/47; 377/44; 377/118; 377/124

(58) Field of Classification Search .............. None
See application file for complete search history.

(56) References Cited

U.S. PATENT DOCUMENTS

| | | | | |
|---|---|---|---|---|
| 3,849,635 A | * | 11/1974 | Freedman | ............... 377/44 |
| 4,545,063 A | * | 10/1985 | Kamimaru | ............... 377/52 |
| 5,020,082 A | * | 5/1991 | Takeda | ............... 377/44 |
| 5,428,654 A | * | 6/1995 | Baqai | ............... 377/34 |
| 5,469,485 A | * | 11/1995 | Ferrant | ............... 377/107 |
| 5,987,089 A | * | 11/1999 | Hawkins, Jr. | ............... 377/47 |
| 6,826,250 B2 | * | 11/2004 | Groo | ............... 377/47 |

* cited by examiner

*Primary Examiner*—Tuan Lam
(74) *Attorney, Agent, or Firm*—Finnegan, et al.

(57) ABSTRACT

A multi-bit counter is provided. The multi-bit counter includes a plurality of asynchronous base counter cells coupled in series, the asynchronous base counter cells having a plurality of input terminals. The multi-bit counter also includes at least one logic gate coupled to at least one of the input terminals of at least one of the plurality of asynchronous base counter cells, a reload signal being input into the asynchronous base counter cells, a clock signal being input into the asynchronous base counter cells, and an input voltage being input into the asynchronous base counter cells, wherein the multi-bit counter is synchronous with the clock signal.

13 Claims, 4 Drawing Sheets

HIGH SPEED HYBRID STRUCTURE COUNTER HAVING SYNCHRONOUS TIMING AND ASYNCHRONOUS COUNTER CELLS

BACKGROUND

1. Technical Field

The present invention is related to a counter circuit and, in particular, to a high-speed hybrid structure counter having synchronous timing and asynchronous counter cells.

2. Discussion of Related Art

Multi-bit counter circuits are needed in many circuit applications, for example in phase-locked loop frequency dividers, and spread spectrum control dividers. In typical applications, counter circuits are at least 16-bits in size, and work at a frequency up to about 800 MHz. Counter circuits used in these typical applications may be either asynchronous or synchronous in their operation. In a synchronous counter circuit, there is a common source of clock pulses driving all of the components of the circuit. In an asynchronous counter circuit, components of the circuit are not driven by a common clock signal, and each component may be driven by a separate clock signal.

An asynchronous frequency divider has a relatively simple structure, and therefore occupies the least area, allowing for increased integration. Asynchronous frequency dividers, however, are delay dependent and are difficult to operate at high frequencies. A synchronous frequency divider, on the other hand, is more stable at nominal and high frequencies, but it has a relatively complicated circuit design, resulting in a larger footprint and increased power consumption, which makes synchronous designs more difficult to integrate. Moreover, synchronous frequency dividers often have a complex control logic, and a long delay path, which impedes the divider from operating. Typically, a delay cell or delay circuit is incorporated into synchronous frequency dividers to compensate for variable delay paths to improve operation at higher frequencies. However, because delay cells can have a large variance, and are often temperature and voltage sensitive, the use of these delay cells often have a negative impact on circuit performance.

Therefore, there is a need for more robust counter circuits capable of operating at higher frequencies while having simpler circuit design and smaller footprints.

BRIEF SUMMARY

In accordance with aspects of the present invention, there is provided a multi-bit counter having synchronous timing, with a base cell formed of multi-bit asynchronous circuits. Some embodiments of a multi-bit timer according to the present invention includes a plurality of asynchronous base counter cells coupled in series, the asynchronous base counter cells having a plurality of inputs, at least one logic gate coupled to at least one of the plurality of asynchronous base counter cells, a reload signal being input into the asynchronous base counter cells, a clock signal being input into the asynchronous base counter cells, and an input voltage being input into the asynchronous base counter cells.

A phase-locked loop feedback programmable divider, utilizing some embodiments of the present invention can include a phase frequency detector, a charge pump and loop filter, a voltage-controlled oscillator, a predivider, and a programmable divider, wherein the programmable divider comprises a multi-bit counter having synchronous timing, the counter including a plurality of asynchronous base counter cells coupled in series.

It is to be understood that both the foregoing general description and the following detailed description are exemplary and explanatory only and are not restrictive of the invention. Further embodiments and aspects of the invention are described with reference to the accompanying drawings, which are incorporated in and constitute a part of this specification.

DETAILED DESCRIPTION

Reference will now be made in detail to the embodiments consistent with the present invention, examples of which are illustrated in the accompanying drawings. Wherever possible, the same reference numbers will be used throughout the drawings to refer to the same or like parts.

A novel counter circuit is provided which may have a hybrid synchronous and asynchronous structure. Consistent with the present invention, there is provided a counter having synchronous timing, the counter being comprised of a plurality of asynchronous base counter cells. There is also provided a phase-locked loop feedback divider which makes use of the hybrid counter and a pseudo-synchronous count control circuit.

In order to utilize the benefits of both synchronous and asynchronous designs, a frequency divider having a hybrid structure of both synchronous and asynchronous design may offer a circuit which balances performance, integration ability, and cost. Consistent with embodiments of the present invention, there is provided hybrid structure wherein the circuit may be designed to be synchronous, to take advantage of the benefits of synchronous frequency dividers. The base cell of the synchronous circuit, however, may be multi-bit asynchronous, thus reducing cost and complexity.

Moreover, because embodiments of the base cell may have a multi-bit design, the control logic of the synchronous circuit may be simplified and any associated delay path may be reduced. By utilizing such a hybrid structure, a circuit consistent with the present invention may achieve higher frequencies with reduced area and power cost compared with frequency dividers of the prior art.

Figure 1:
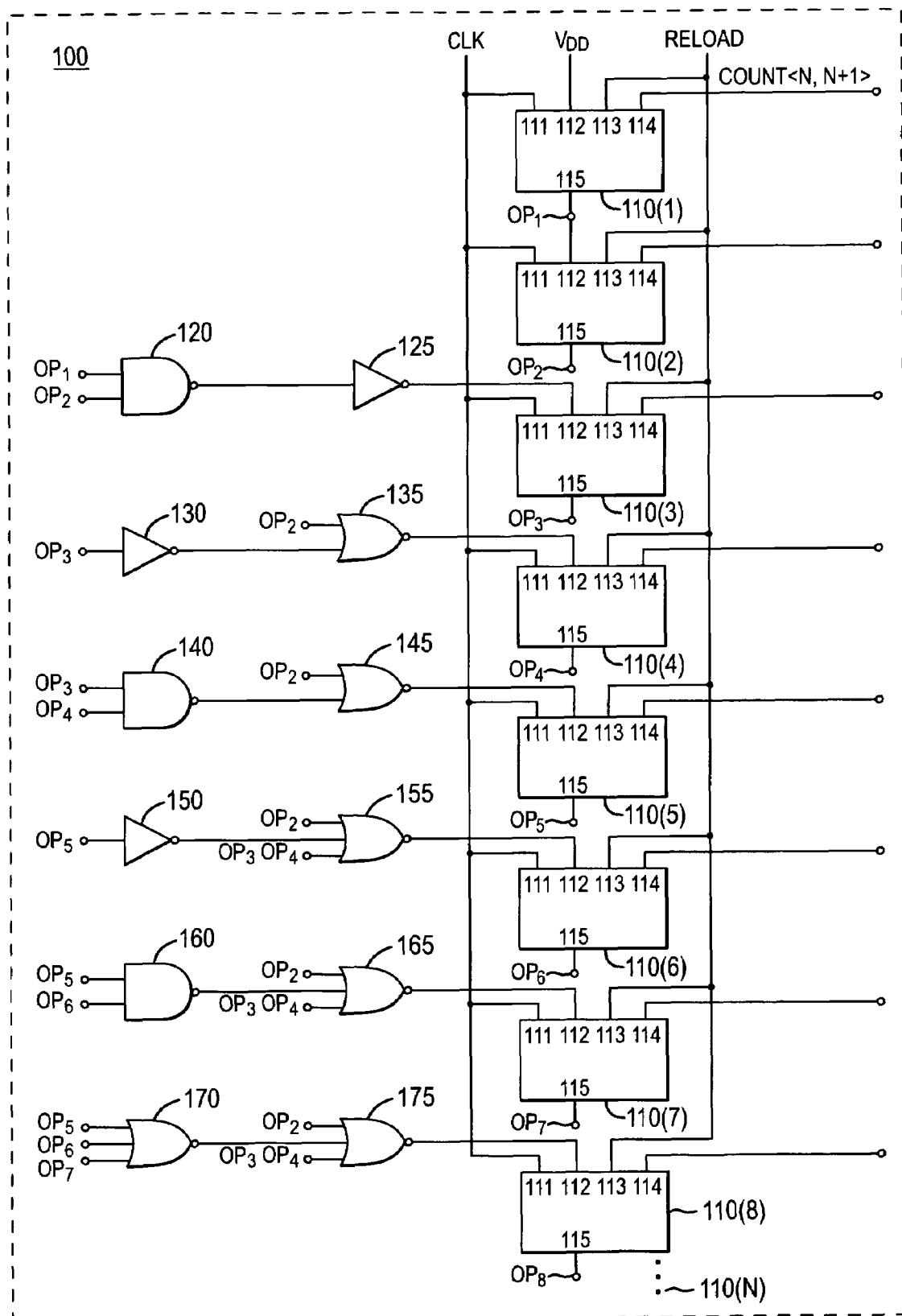
FIG. 1 shows a circuit diagram illustrating a multi-bit counter consistent with some embodiments of the present invention.

FIG. 1 is a circuit diagram illustrating a multi-bit counter 100 consistent with the present invention. As shown in FIG. 1, a multi-bit counter 100 includes a plurality of base counter cells 110(1) through 110(N). Although multi-bit counter 100 can include any number of base counter cells 110, the particular example of multi-bit counter 100 shown in FIG. 1 includes (8) base counter cells 110(1)-110(8) coupled in series. Into each base counter cell 110, a number of signals, for example, four signals, may be input at inputs 111-114, and a cell output $OP_N$ may be output at output 115. As shown in FIG. 1, counter 100 has synchronous timing as each base counter cell 110 has a common clock signal CLK input at input 111. A voltage $V_{DD}$ may be input into a first base counter cell 110 at input 112. An input signal, as described below, may be fed into input 112 in subsequent base counter cells, cells 110(3) though 110(N).

A reload signal may be input into each base counter cell 110 at input 113, and a count signal may be input into each base counter cell at input 114. A pulse count signal Count, which may comprise an N component and an N+1 component, may be input into each base counter cell at input 114.

As shown in FIG. 1, the output signal 115 of base counter cell 110(1), cell output $OP_1$, is directly input into subsequent base counter cell 110(2). For subsequent base counter cells 110 (3 . . . N), however, cell outputs $OP_N$ are combined in logic gates prior to being input into base counter cell 110(3 . . . N). For example, as illustrated in FIG. 1, cell output signals $OP_1$ and $OP_2$ are input into NAND gate 120, and the signal output from NAND gate 120 is input into inverter 125. The signal output from inverter 125 is then input into base counter cell 110(3) at input 112.

To determine the input signals to base counter cell 110(4), cell output signal $OP_3$ is input into inverter 130, and the signals output from inverter 130 and cell output $OP_2$ is input into NOR gate 135. The signal output of NOR gate 135 is then input into base counter cell 110(4) at input 112.

To determine the input signals to base counter cell 110(5), cell output signals $OP_3$ and $OP_4$ are input into NAND gate 140. The signals output from NAND gate 140 and cell output $OP_2$ is input into NOR gate 145, and the signal output from NOR gate 145 is input into base counter cell 110(5) at input 112.

To determine the input signals to base counter cell 110(6), cell output signal $OP_5$ is input into inverter 150, and the signal output from inverter 150, along with cell output signal $OP_2$ and a combined signal including cell output signals $OP_3$ and $OP_4$, is input into NOR gate 155. The signal output from NOR gate 155 is then input into base counter cell 110(6) at input 112.

To determine the input signals to base counter cell 110(7), cell output signals $OP_5$ and $OP_6$ are input into NAND gate 160. The signal output from NAND gate 160, along with cell output signal $OP_2$ and a combined signal including cell outputs signals $OP_3$ and $OP_4$ is input into NOR gate 165. The signal output from NOR gate 165 is then input into base counter cell 110(7) at input 112.

To determine the input signals to base counter cell 110(8), cell output signals $OP_5$, $OP_6$, and $OP_7$ are input into NAND gate 170. The output signals from NAND gate 170, along with cell output signal $OP_2$ and a combined signal including cell output signals $OP_3$ and $OP_4$, is input into NOR gate 175. The signal output from NOR gate 175 is then input into base counter cell 110(8) at input 112.

As illustrated in FIG. 1, the delay path is only as large as two logic gates outside of base counter cell 110. By minimizing the delay path, faster counter control logic may be designed. For example, counter circuit 100, designed consistent with the present invention, may allow stable performance at frequencies over 800 MHz. Base counter cells 110 may be synchronous or asynchronous, single bit, or multi-bit. In some embodiments of the present invention, however, base counter cells 110 include multi-bit asynchronous counter cells, as described below in conjunction with FIG. 2.

Figure 2:
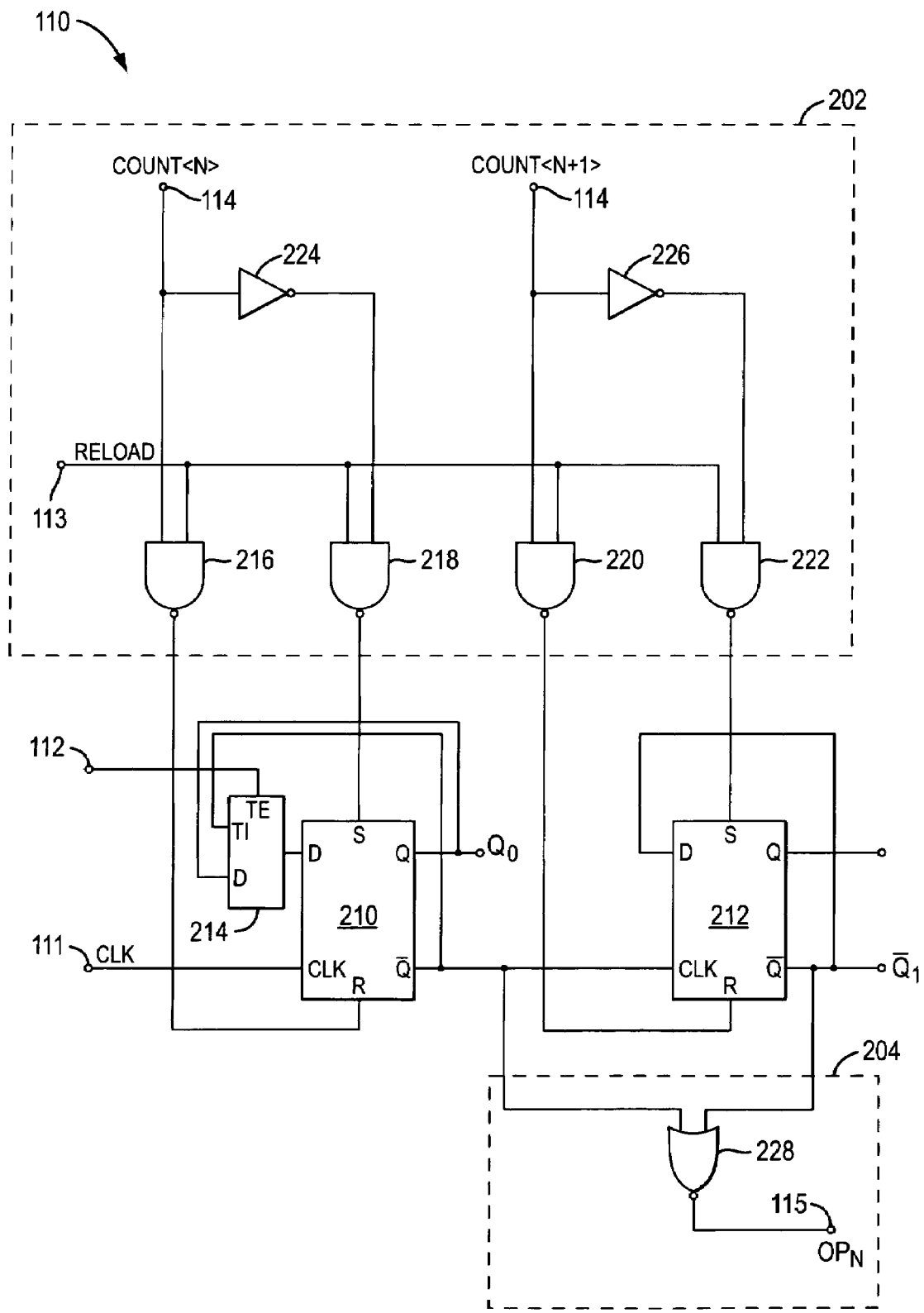
FIG. 2 shows a circuit diagram illustrating a multi-bit asynchronous counter cell, consistent with some embodiments of the present invention.

FIG. 2 shows a circuit diagram illustrating a multi-bit asynchronous base counter cell 110, consistent with some embodiments of the present invention. The embodiment of base counter cell 110 shown in FIG. 2 includes two flip-flops 210 and 212 coupled to a circuit for building a count reload function 202, and a base counter cell output circuit 204. In some embodiments of the present invention, flip-flops 210 and 212 may be D-type flip-flops, having inputs for data D, clock signal CLK, set signal S, reset signal R, and having output signal Q, and complementary output signal $\overline{Q}$. As shown in FIG. 2, complementary output signal $\overline{Q}$ of flip-flop 210 is fed into clock input CLK of flip-flop 212. Thus, because the clock signals input into flip-flop 210 and flip-flop 212 may be different, the counter cell is considered asynchronous.

In some embodiments of the present invention, flip-flop 210 may have a synchronous load 214 coupled to data input D. Synchronous load 214 may have inputs D, TI, and TE. An output signal Q of flip-flop 210 can be input into synchronous load input D. Complementary output signal $\overline{Q}$ of flip-flop 210 can be input into input TI of synchronous load 214. A signal at input 112 of base counter cell 110, as shown in FIG. 1, can be input into input TE of synchronous load 214. In some embodiments of the present invention, if the signal input into TE is a logic high, the next state of flip-flop 210 will be the same as the signal input into TI. If the signal input into TE is a logic low, the next state of flip-flop 210 will be the same as the signal input into D. Flip-flop 212 may be a normal D-type flip-flop which performs a divide-by-2 operation on an output signal of flip-flop 210.

As shown in FIG. 2, some embodiments of base counter cells 110 may also include a circuit for building a count reload function 202, which, in FIG. 2, includes NAND gates 216, 218, 220, and 222, and inverter gates 224, and 226. The circuit for building a count reload function 202 may be coupled to flip-flops 210 and 212, and may provide inputs for set S and reset R inputs of flip-flops 210 and 212. To determine the set S and reset R inputs, component N of count signal Count may be input into inverter 224, and a second input of NAND gate 216. Component N+1 of count signal Count may be input into inverter 226 and a second input of NAND gate 220. The output signal of inverter 224 is input into the first input of NAND gate 218, and the output signal of inverter 226 is input into the first input of NAND gate 222. The reload signal may be input into the first input of NAND gate 216, the second input of NAND gate 218, the first input of NAND gate 220, and the second input of NAND gate 222. The output signal of NAND gate 216 is input into reset input R of flip-flop 210, the output signal of NAND gate 218 is input into set input S of flip-flop 210, the output signal of NAND gate 220 is input into reset input R of flip-flop 212, and the output of NAND gate 222 is input into set input S of flip-flop 212.

As also shown in FIG. 2, base counter cell 110 may further include base counter cell output circuit 204, which comprises a NOR gate 228. In operation, complementary output signal $\overline{Q}$ of flip-flop 210 is a first input signal of NOR gate 228, and complementary output signal $\overline{Q}$ of flip-flop 212 is a second input signal of NOR gate 228. The output signal from NOR gate 228 is the output of base counter cell 110 $OP_N$, which may be used to determine the cell input signal at input 112, as shown in FIG. 1. Output signal Q of flip-flops 210 and 212 may be used as an input signal for other circuits coupled to base counter cell 110, or other base counter cells 110 coupled in series.

Figure 3:
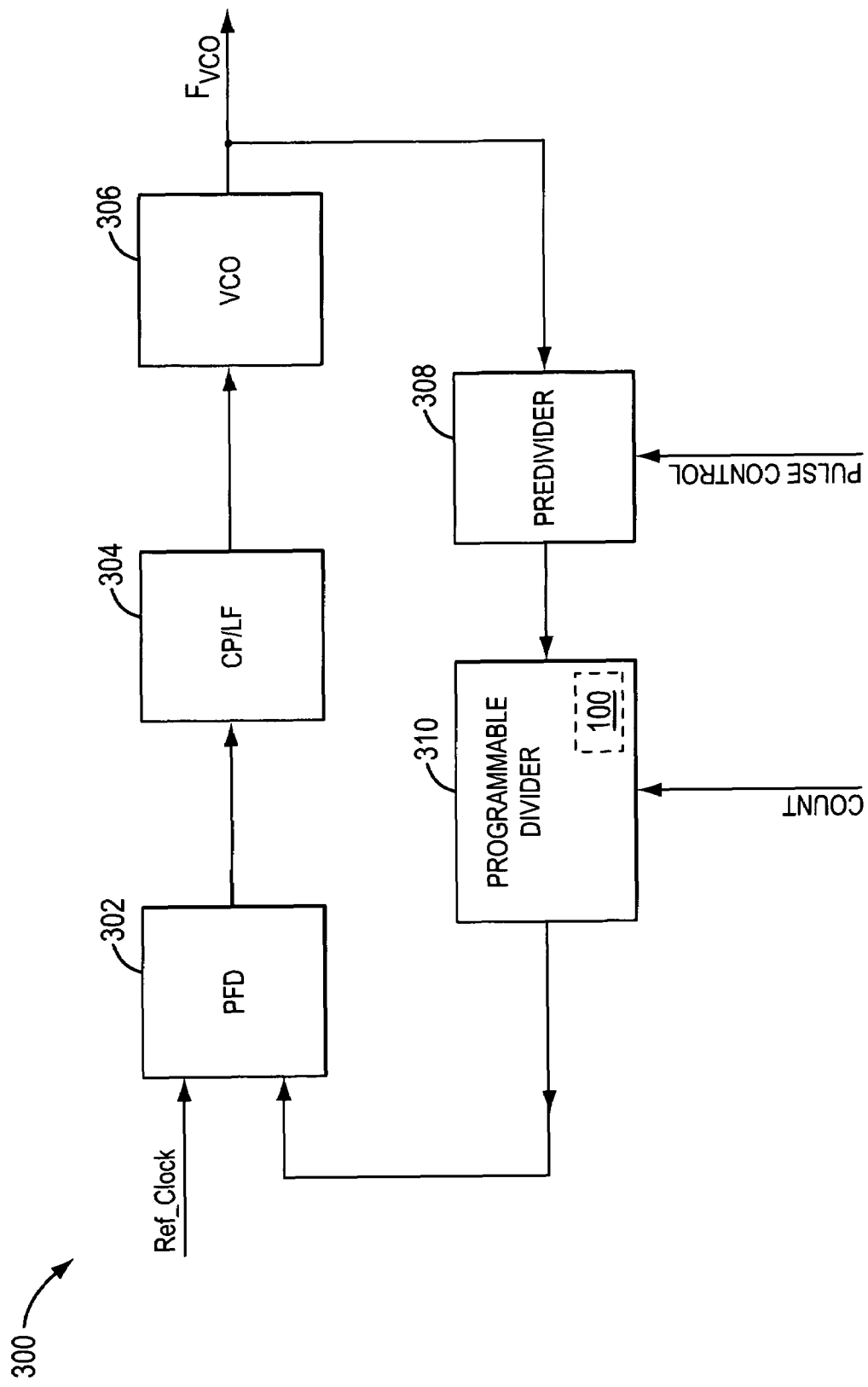
FIG. 3 is a diagram of a phase-locked loop programmable frequency divider which uses the multi-bit counter of FIG. 1, consistent with some embodiments of the present invention.

FIG. 3 is a diagram of a phase-locked loop programmable frequency divider 300 which uses the multi-bit counter 100 such as that shown in FIG. 1 in a programmable divider. The embodiment of phase-locked loop programmable frequency divider 300 shown in FIG. 3 includes phase frequency detector 302 coupled to charge pump/loop filter 304, which is coupled to variable controlled oscillator 306. A predivider 308 received the output signal from VCO 306 and may then be coupled to programmable divider 310, which may include multi-bit counter 100.

Phase-locked loop programmable frequency divider 300 may be similar to known phase-locked loop programmable frequency dividers. However, as shown in FIG. 3, phase-locked loop programmable frequency divider 300 in accordance with the present invention includes multi-bit counter 100 in programmable divider 310. In operation, a reference clock signal Ref_Clock and an output of programmable divider 310, as feedback, may be input into phase frequency detector 302. An output signal from phase frequency detector 302 is input into charge pump/loop filter 304. An output signal from charge pump/loop filter may be input into voltage-controlled-oscillator 306, which outputs a voltage-controlled function $F_{VCO}$ and a signal which is input into predivider 308. Predivider 308, from the input of voltage-controlled oscillator 306 and a pulse control signal provided from a counter control circuit (shown in FIG. 4), outputs a signal to programmable divider 310. Programmable divider 310 utilizes the signal from predivider 308 in conjunction with a count signal Count, input at terminal 114 as shown in FIGS. 1 and 2, to produce the output signal that is received by phase frequency detector 302.

Embodiments of phase-locked loop programmable frequency divider 300 that incorporate embodiments of multi-bit counter 100 in programmable divider 310 may operate at higher frequencies without the need for a large amount of circuit space for a counter. Such utilization may allow phase-locked loop programmable frequency divider 300 to have better performance and be more easily integrated into smaller devices.

Figure 4:
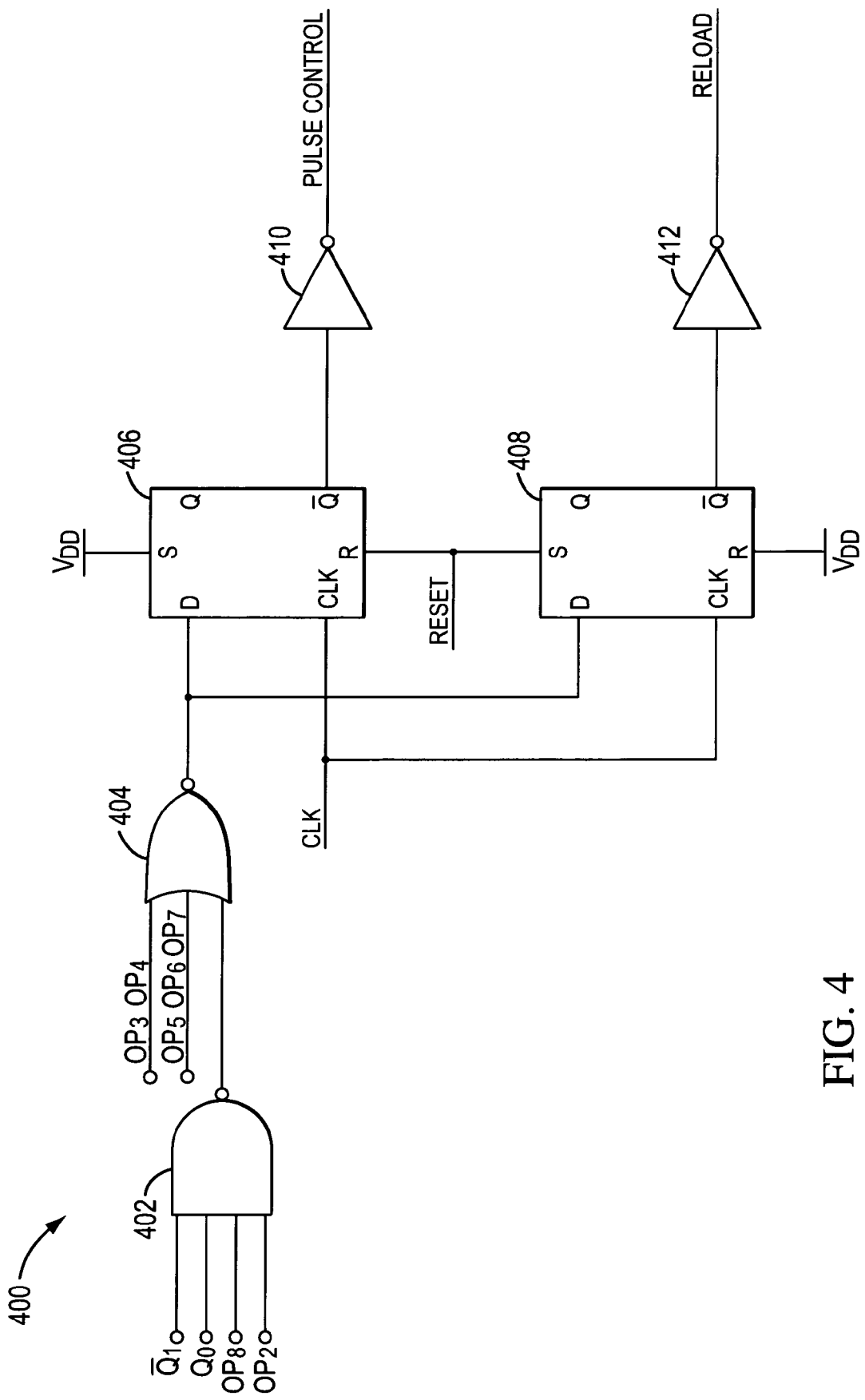
FIG. 4 is a circuit diagram illustrating a count control circuit consistent with some embodiments of the present invention.

FIG. 4 shows a circuit diagram illustrating a count control circuit 400 according to some embodiments of the present invention. As illustrated in FIG. 4, count control circuit 400 may include four-input NAND gate 402, NOR gate 404, flip-flop 406, flip-flop 408, inverter gate 410 and inverter gate 412. In accordance with some embodiments of the present invention, flip-flops 406 and 408 may be D-type flip-flops having data input D, clock signal input CLK for receiving clock signal CLK, set input S, reset input R, and outputs Q and $\overline{Q}$. Further consistent with the present invention voltage $V_{DD}$ may be input into set input S of flip-flop 406 and into reset input R of flip-flop 408, and a reset signal may be input into set input S of flip-flop 408 and into reset input R of flip-flop 406.

As shown in FIG. 4, count control circuit 400 may receive as input signals or values output from base counter cell 110, as shown in FIG. 1 and FIG. 2. For example, NAND gate 402 may receive signals at inputs $\overline{Q}_1$, and $Q_0$, from FIG. 2, and $OP_8$, and $OP_1$ from FIG. 1. The signal output from NAND gate 402 is input into NOR gate 404. Along with the output signal of NAND gate 402, a combined signal including the signals output from $OP_3$ and $OP_4$, and a combined signal including the signals output from $OP_5$, $OP_6$, and $OP_7$, are input into NOR gate 404. The signal output from NOR gate 404 may then be input into data input D of flip-flop 406 and flip-flop 408. A signal output from complementary output $\overline{Q}$ of flip-flop 406 may be received by inverter 410, and a signal output from complementary output $\overline{Q}$ of flip-flop 408 may be received by inverter gate 412. The signal output from inverter gate 410 may be a pulse control, or count control signal, which, as shown in FIG. 3, may be input into predivider 308, when count control circuit 400 is used in phase-locked loop programmable frequency divider 300. The signal output from inverter gate 412 may be the reload signal, which may be input to multi-bit counter cell 100 and individual base counter cells 110, as shown in FIGS. 1 and 2.

As shown in FIG. 4, the delay path may only be as long as NAND gate 402, NOR gate 404, and NOR gate 228 (shown in FIG. 2). The reduced delay path also reduces the signal delay in a circuit including multi-bit counter 100 used in conjunction with count control circuit 400. The reduced delay may allow circuits incorporating multi-bit counter 100 used in conjunction with count control circuit 400 to have improved performance at higher operating frequencies.

In accordance with some embodiments of the present invention, there is provided a counter having a hybrid synchronous/asynchronous structure, which may allow for increased performance and integration at lower costs. Moreover, when used in a phase-locked loop frequency divider with a count control circuit in accordance with some embodiments of the present invention, the phase-locked loop frequency divider may have improved performance, and may operate at higher frequencies.

Other embodiments consistent with the present invention will be apparent to those skilled in the art from consideration of the specification and practice of the invention disclosed herein. It is intended that the specification and examples be considered as exemplary only. Accordingly, the invention should only be limited by the following claims.

What is claimed is:

1. A multi-bit counter, comprising:
 a plurality of asynchronous base counter cells coupled in series, the asynchronous base counter cells having a plurality of input terminals;
 at least one logic gate coupled to at least one of the input terminals of at least one of the plurality of asynchronous base counter cells;
 a reload signal being input into the asynchronous base counter cells; a clock signal being input into the asynchronous base counter cells; and
 an input voltage being input into the asynchronous base counter cells, wherein the multi-bit counter is synchronous with the clock signal;
 further wherein the asynchronous base counter cells comprise:
 a first flip-flop operably coupled to a second flip-flop;
 a circuit for building a count reload function operably coupled to the first and second flip-flop;
 and an output circuit operably coupled to the first and second flip-flop, the output circuit providing an output signal from one of the plurality of asynchronous base counter cells to a subsequent one of the plurality of asynchronous base counter cells.

2. The multi-bit counter of claim 1, wherein:
 the first flip-flop comprises a D-type flip-flop having a synchronous load function;
 the second flip-flop comprises a D-type flip flop.

3. The multi-bit counter of claim 1, wherein the second flip-flop performs an asynchronous divide-by-2 operation on a signal output from the first flip-flop.

4. The multi-bit counter of claim 1, wherein the circuit for building a count reload function comprises:
 a first NAND gate, having first and second inputs, operably coupled to a first input of the first flip-flop;
 a second NAND gate, having first and second inputs, operably coupled to a second input of the first flip-flop;
 a third NAND gate, having first and second inputs, operably coupled to a first input of the second flip-flop; and
 a fourth NAND gate, having first and second inputs, operably coupled to a second input of the second flip-flop.

5. The multi-bit counter of claim 4, wherein the circuit for building a count reload function further comprises:
   a first inverter gate, an input of the first inverter gate operably coupled to the second input of the first NAND gate and an output of the first inverter gate operably coupled to the first input of the second NAND gate; and
   a second inverter gate, an input of the second inverter gate operably coupled to the second input of the third NAND gate and an output of the second inverter gate operably coupled to the first input of the fourth NAND gate.

6. The multi-bit counter of claim 4, wherein the reload signal is input into the first input of the first NAND gate, the second input of the second NAND gate, the first input of the third NAND gate, and the second input of the fourth NAND gate.

7. The multi-bit counter of claim 5, wherein the circuit for building a count reload function further comprises:
   a first count signal being input into the second input of the first NAND gate and the input of the first inverter gate; and
   a second count signal being input into the second input of the third NAND gate and the input of the second inverter gate.

8. The multi-bit counter of claim 4, wherein the first and second flip-flops each comprise:
   a data input, a clock signal input, a set input, a reset input, a first output and a second output.

9. The multi-bit counter of claim 8, wherein:
   the clock signal is input into the clock signal input of the first and second flip-flops;
   a signal output from the first NAND gate is input into the reset input of the first flip-flop;
   a signal output from the second NAND gate is input into the set input of the first flip-flop;
   a signal output from the third NAND gate is input into the reset input of the second flip-flop;
   and a signal output from the fourth NAND gate is input into the set input of the second flip-flop.

10. The multi-bit counter of claim 8, wherein signal outputs from the second output of the first flip-flop and the second output of the second flip-flop are input into the output circuit.

11. The multi-bit counter of claim 10, wherein the output circuit comprises a NOR gate.

12. The multi-bit counter of claim 2, wherein a load of the first flip-flop comprises a cell input signal, the cell input signal comprising a signal output from one of the plurality of asynchronous base counter cells.

13. The multi-bit counter of claim 12, wherein when the cell input signal is low, data is input into the first flip-flop.

* * * * *